United States Patent
Schrott et al.

(10) Patent No.: US 8,680,501 B2
(45) Date of Patent: *Mar. 25, 2014

(54) MEMORY CELL WITH POST DEPOSITION METHOD FOR REGROWTH OF CRYSTALLINE PHASE CHANGE MATERIAL

(71) Applicant: International Business Machines Corporation, Armonk, NY (US)

(72) Inventors: Alejandro G. Schrott, New York, NY (US); Chung H. Lam, Peekskill, NY (US); Stephen M. Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/736,189

(22) Filed: Jan. 8, 2013

(65) Prior Publication Data

US 2013/0119339 A1    May 16, 2013

Related U.S. Application Data

(62) Division of application No. 13/150,705, filed on Jun. 1, 2011, now Pat. No. 8,354,659, which is a division of application No. 12/702,406, filed on Feb. 9, 2010, now Pat. No. 8,017,433.

(51) Int. Cl.
*H01L 29/02*    (2006.01)

(52) U.S. Cl.
USPC .............................................. 257/2

(58) Field of Classification Search
None
See application file for complete search history.

(56) References Cited

U.S. PATENT DOCUMENTS

| | | | |
|---|---|---|---|
| 7,417,245 B2 | 8/2008 | Happ et al. | 257/2 |
| 7,642,125 B2 | 1/2010 | Lung et al. | 438/102 |
| 7,786,461 B2 | 8/2010 | Lung | 257/2 |
| 2007/0096162 A1 | 5/2007 | Happ et al. | 257/246 |
| 2007/0249116 A1 | 10/2007 | Philipp et al. | 438/239 |
| 2008/0048168 A1 | 2/2008 | Sato | 257/3 |
| 2008/0116442 A1 | 5/2008 | Nirschl et al. | 257/4 |
| 2008/0266940 A1 | 10/2008 | Lai et al. | 365/163 |
| 2009/0173929 A1 | 7/2009 | Gidon | 257/3 |
| 2010/0015785 A1 | 1/2010 | Jeong et al. | 438/466 |
| 2010/0133503 A1 | 6/2010 | Kuo et al. | 257/5 |
| 2010/0156588 A1 | 6/2010 | Privitera | 338/7 |

*Primary Examiner* — Scott B Geyer
(74) *Attorney, Agent, or Firm* — Ido Tuchman; Vazken Alexanian (57) ABSTRACT

A phase change memory cell with substantially void free crystalline phase change material. An example memory cell includes a substrate and a bottom electrode carried by the substrate. The bottom electrode is a thermal conductor. A phase change layer includes phase change material. The phase change layer is void free within a switching region when the phase change material is in a crystalline phase. A top electrode is positioned over the phase change layer.

9 Claims, 13 Drawing Sheets

MEMORY CELL WITH POST DEPOSITION METHOD FOR REGROWTH OF CRYSTALLINE PHASE CHANGE MATERIAL

SUMMARY

This application is a divisional application claiming benefit under 35 U.S.C. §120 to the filing date of U.S. patent application Ser. No. 13/150,705 filed Jun. 1, 2011, which is a divisional application of U.S. Pat. No. 8,017,433 issued Sep. 13, 2011, the entire text of which is specifically incorporated by reference herein.

BACKGROUND

1. Field of the Invention

The present invention relates to computer memory, and more specifically to forming substantially void free crystalline phase change material in phase change memory cells.

2. Description of Background

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM); non-volatile memory devices being memory in which the state of the memory elements can be retained for days to decades without power consumption. Examples of volatile memory devices include Dynamic Random Access Memory (DRAM) and Static Random Access Memory (SRAM); where DRAM requires the memory element to be constantly refreshed while SRAM requires a constant supply of energy to maintain the state of the memory element.

The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common elements in the group used to produce a chalcogenide semiconductor when creating a phase change memory cell. An example of this would be Ge2Sb2Te5 (GST), SbTe, and In2Se3.

Altering the phase change material's state typically requires heating the material to a melting point and then cooling the material to one of the possible states. A current passed through the phase change material creates ohmic heating and causes the phase change material to melt. A balance between the ohmic heating and heat flow produces a melting region (also referred to herein as a "switching region") whose cross section minimum is defined by the diameter of the bottom electrode. In the latter, melting and gradually cooling down the phase change material allows time for the phase change material to form the crystalline state, while melting and abruptly cooling the phase change material quenches the phase change material into the amorphous state.

A problem in phase change memory is that voids may be dispersed in crystalline phase change material. Since phase change material shrinks in the crystalline phase and expands in the amorphous phase, voids can form throughout the phase change material as the phase change material crystallizes during cell construction. As a result, the properties of the phase change material, such as resistance and uniformity, become erratic.

SUMMARY

One example aspect of the invention is a memory cell. The memory cell includes a substrate. The memory cell includes a bottom electrode carried by the substrate. The bottom electrode is comprised of a thermal conductor. The memory cell includes a phase change layer including phase change material. The memory cell also includes a switching region within the phase change layer which is void free. The memory cell also includes a top electrode over the phase change layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-11.

During phase change memory cell construction, the phase change material usually becomes crystalline since the materials are typically heated above 250° C. As described in detail below, an embodiment of the current invention is a method for re-crystallizing phase change material in a memory cell. During this crystallization, voids in the switching region of the phase change material are removed such that the phase change material is substantially void free. The re-crystallization of the phase change material may be performed with a rapid thermal anneal (RTA). The rapid thermal anneal heats the phase change material so that it melts for a short period of time (for example, between one to five seconds). The cooling of the phase change material from the bottom electrode causes the voids in the phase change material to migrate away from the switching region of the phase change layer instead of being dispersed throughout. As a result, the voids are easily removed with a chemical mechanical polish (CMP) or with other polishing processes known to those skilled in the art.

Figure 1A:
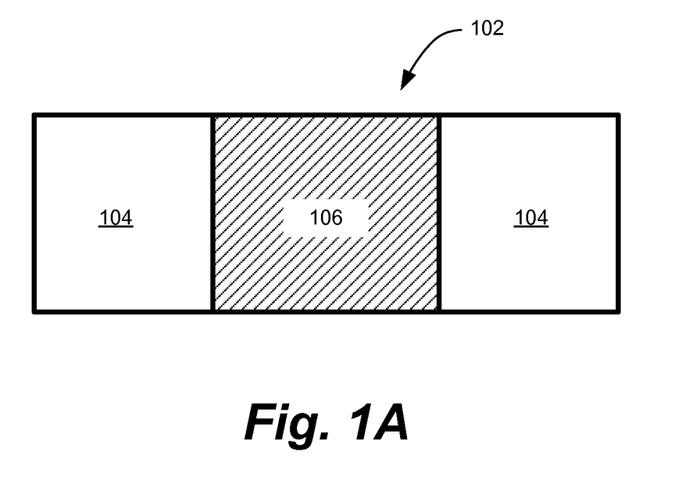
FIG. 1A shows a portion of a starting wafer contemplated by an embodiment of the present invention. The staring wafer includes a substrate and a bottom electrode.

In FIG. 1A, a portion of an example starting wafer 102 is shown. The starting wafer 102 includes a substrate 104 and the bottom electrode 106. The substrate 104 may be composed of a dielectric, such as silicon oxide, silicon nitride or a combination thereof. The bottom electrode 106 includes a thermally conducting and electrically conducting material. Those skilled in the art will recognize that a variety of materials may be utilized for the bottom electrode such as, but not limited to, titanium nitride (TiN) and tungsten (W).

Figure 1B:
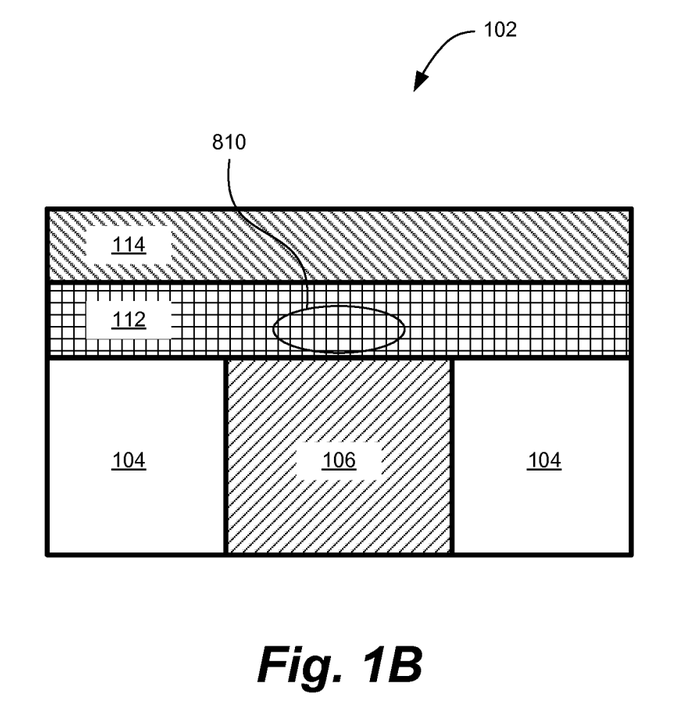
FIG. 1B shows a phase change material layer and a thermally insulating layer on top of the portion of the substrate.

In FIG. 1B, a phase change material layer 112 is deposited over the substrate and electrode, followed by a thermally insulating layer 114 formed above the phase change material 112. The thermally insulating layer 114 has a lower heat conductivity than the bottom electrode 106. The thermally insulating layer 114 is primarily used to trap heat and to cause heating and cooling of the phase change material from the bottom up (as described below). In one embodiment, the thermally insulating layer 114 is comprised of 80 percent ZnS (zinc sulfide) and 20 percent SiO2 (silicon dioxide).

Figure 1C:
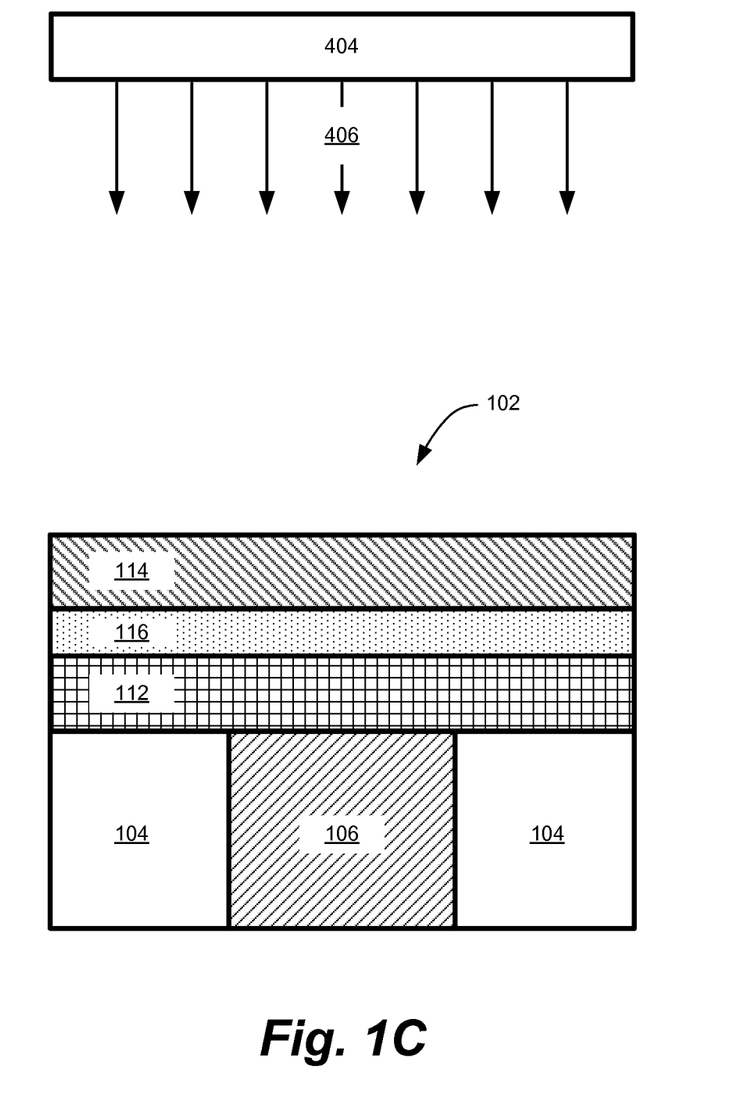
FIG. 1C shows a capping layer formed between the phase change material and the thermally insulating layer.

FIG. 1C shows an alternative intermediate step. In this particular embodiment, a capping layer 116 is formed between the phase change material 112 and the insulating layer 114. The capping layer 116 includes material that does not chemically interact with the phase change material 112. Additionally, the capping layer 116 may be a thermally insulating material. A variety of materials may be employed for the capping layer 116 such as, but not limited to, germanium nitride (GeNx), germanium chromium nitride (GeCrNx), or silicon nitride (SiNx).

Figure 2:
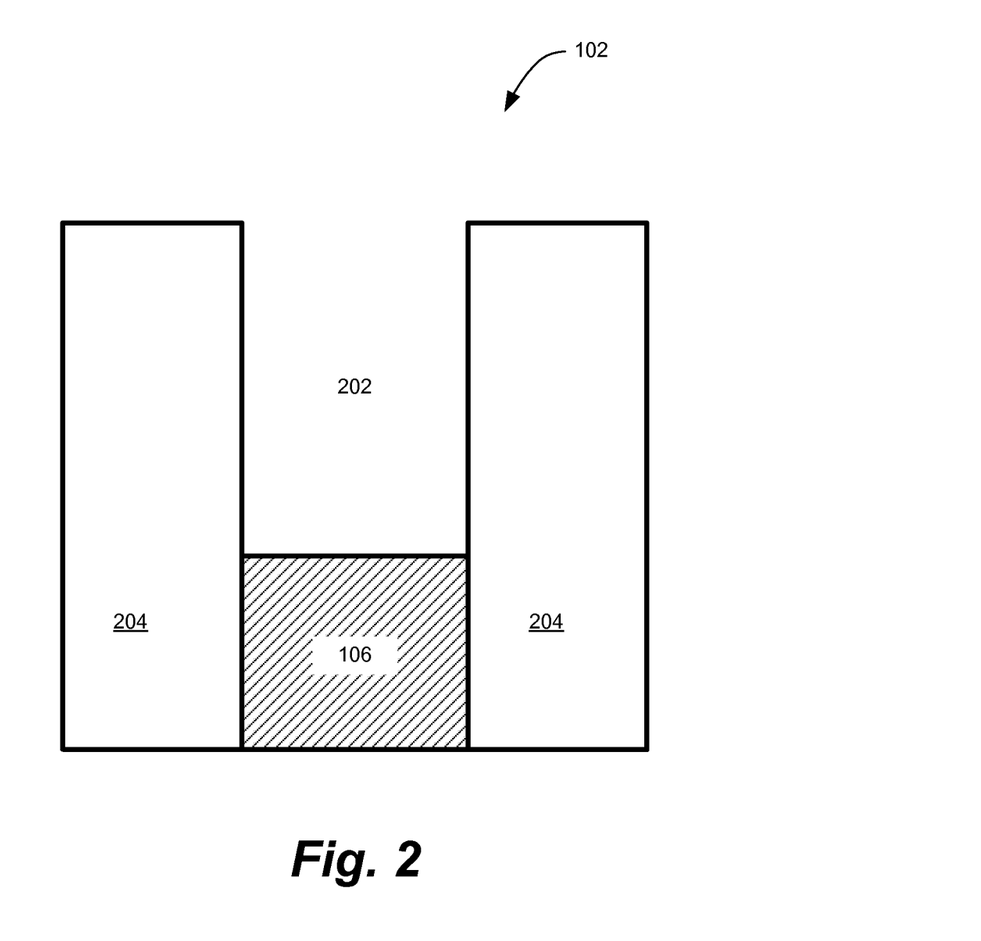
FIG. 2 shows a via formed in the substrate and over the bottom electrode.

In another alternate embodiment of the invention shown in FIG. 2, a via 202 is formed in the extended dielectric 204 and over the bottom electrode 106. The via 202 may be formed by etching through the substrate using a wafer mask. Those skilled in the art will appreciate that various other techniques may be used for creating the via 202. In one embodiment, the bottom electrode 106 forms the bottom of the via 202.

Figure 3:
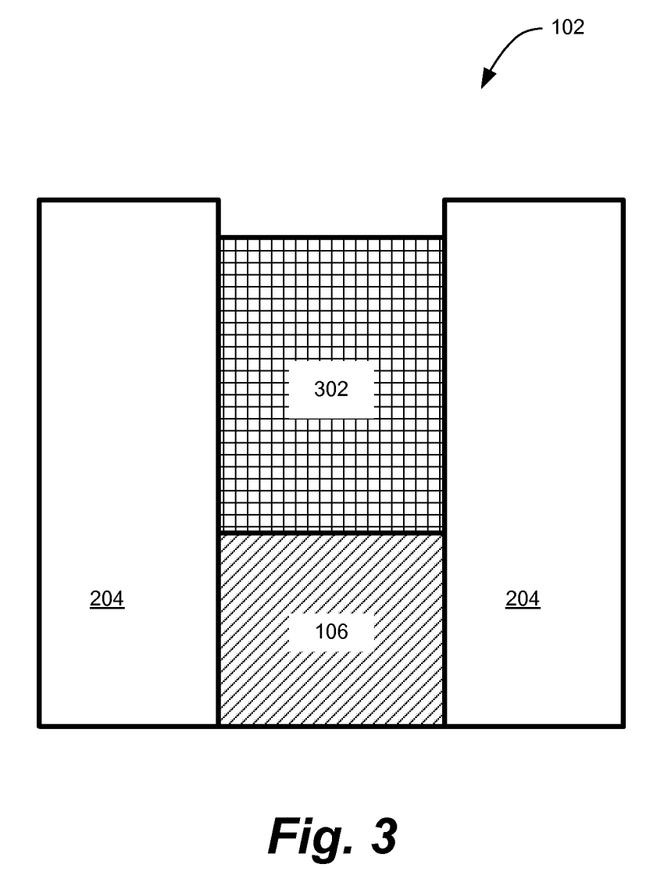
FIG. 3 shows the via filled, at least partially, with phase change material.

In FIG. 3, the via 202 is filled, at least partially, with phase change material 302. As discussed earlier, the phase change material 302 is programmable between an amorphous phase and a crystalline phase. In one embodiment of the invention, the phase change material 302 is deposited in the via 202 is in the amorphous phase. As the phase change material 302 changes from the amorphous phase to the crystalline phase during cell construction, it shrinks. This shrinkage can cause undesirable voids to appear in the phase change material 302. The phase change material 302 may be composed of, for example, Ge2Sb2Te5 (GST), SbTe, and In2Se3. A variety of other materials may be used to from the phase change material 302, as known to those skilled in the art.

Figure 4A:
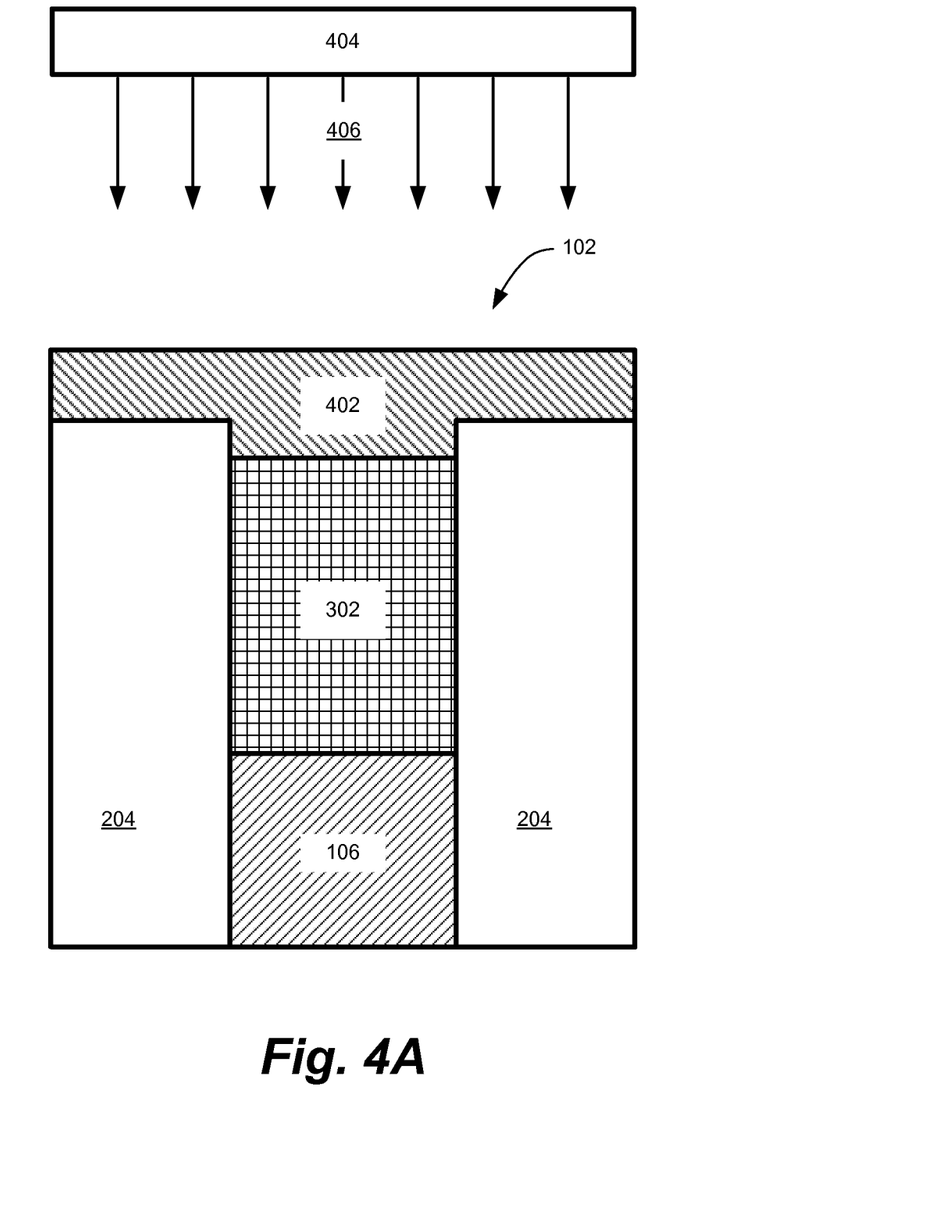
FIG. 4A shows a heater for annealing the phase change material.

In FIG. 4A, a thermally insulating layer 402 is shown formed above the phase change material 302. The thermally insulating layer 402 has a lower heat conductivity than the bottom electrode 106. The thermally insulating layer 402 is primarily used to trap heat and to cause cooling of the phase change material from the bottom up (as described below). In one embodiment, the thermally insulating layer 402 is comprised of 80 percent ZnS (zinc sulfide) and 20 percent SiO2 (silicon dioxide).

Figure 4B:
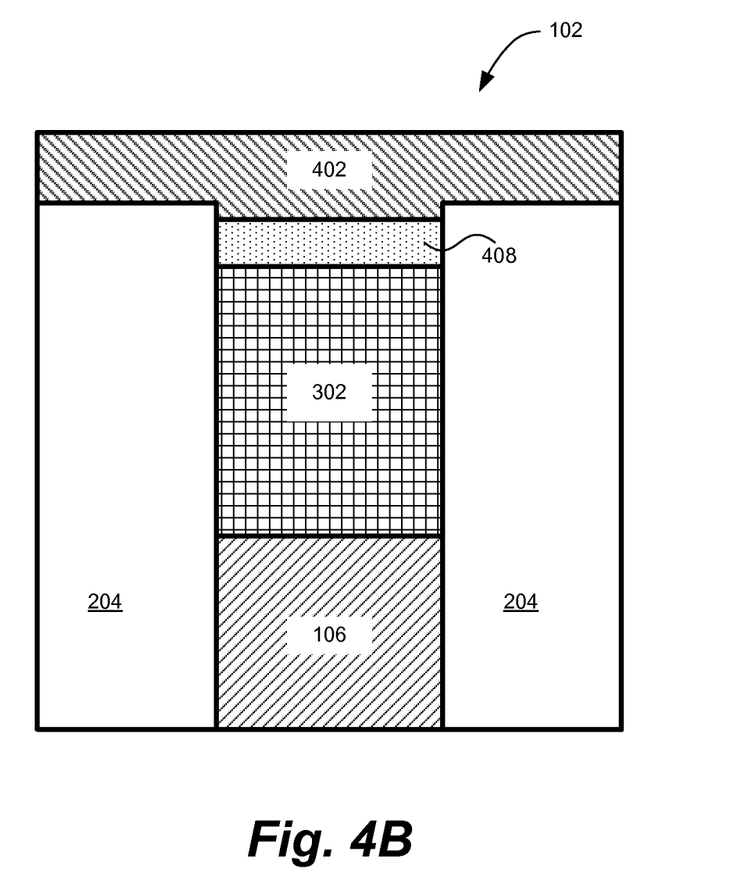
FIG. 4B shows a thermally insulating layer and a capping layer above the phase change material.

FIG. 4B shows an alternative intermediate step. In this particular embodiment, a capping layer 408 is formed between the phase change material 302 and the insulating layer 402. The capping layer 408 includes material that does not chemically interact with the phase change material 302. Additionally, the capping layer 408 may be a thermally insulating material. A variety of materials may be employed for the capping layer 206 such as, but not limited to, germanium nitride (GeNx), germanium chromium nitride (GeCrNx), or silicon nitride (SiNx).

Turning back to FIGS. 1C and 4A, a heater 404 is shown configured to temporarily heat the wafer 102 so that the phase change material 112 and 302 is void free. The heater 404 is positioned such that heat 406 generated by the heater 404 is directed at least to the bottom electrode 106. Since the thermally insulating layer 114 and 402 is formed above the phase change material 302, heat 406 generated by the heater 404 heats the phase change material and, as a result, the phase change material 302 melts. Because of the melt flow due to capillary forces, voids normally dispersed throughout the material congregate at the top of the phase change material 302. As discussed further below, a void free phase change layer is formed due to re-crystallization of at least some of the phase change material 302. Those skilled in the art will recognize that a variety of processes or heaters may be employed to heat the phase change layer from the bottom to the top.

After the wafer 102 is cooled, further fabrication steps include removing the capping 116, 408 and insulating layers 114, 402, limiting each cell via Reactive Ion Etching (RIE) of the phase change material and surrounding the phase change material with dielectric and forming the top electrode. Such fabrication techniques are known to those skilled in the art. These steps discussed in more detail with reference to FIGS. 6 and 7. It should be noted that these steps may also be performed with other invention embodiments discussed herein.

In one embodiment of the invention, which may apply to the various arrangements shown in the Figures, the heater 404 is a laser. The laser is configured to apply at least one laser pulse to the region above the bottom electrode 106. Those skilled in the art will recognize that the strength and wavelength of the laser pulse will be dependent on at least the thickness and materials employed for the phase change material 302, the capping layer 406, and the insulator layer 402.

In a particular embodiment of the invention, which is preferably applied to cell construction including a via, the heater 404 is configured to apply a rapid thermal anneal (RTA). In this embodiment, the heater 404 is configured to heat the wafer 102 to a 400° C. to 450° C. plateau. The heater 404 is then configured to quickly heat the wafer 102 to 700° C. to 750° C. for approximately one second. Since the temperature of crystallization of GST is 600° C., the initial heater temperature is sufficient to melt the phase change material 302. The heater 404 is then configured to cool the wafer 102 for at least four seconds. This allows enough time for the phase change material 302 to cool into a crystalline phase.

The heating process causes the phase change material 302 to anneal in the via 202 such that the phase change material progressively crystallizes up the via starting from the bottom electrode. This is because the bottom electrode 106 is heat conducting and therefore causes the phase change material at the bottom of the via 202 to cool faster than the phase change material at the top of the via 202. Conversely, the thermally insulating layer 402 causes the phase change material at the top of the via 202 to cool slower than the phase change material at the bottom of the via.

Figure 5:
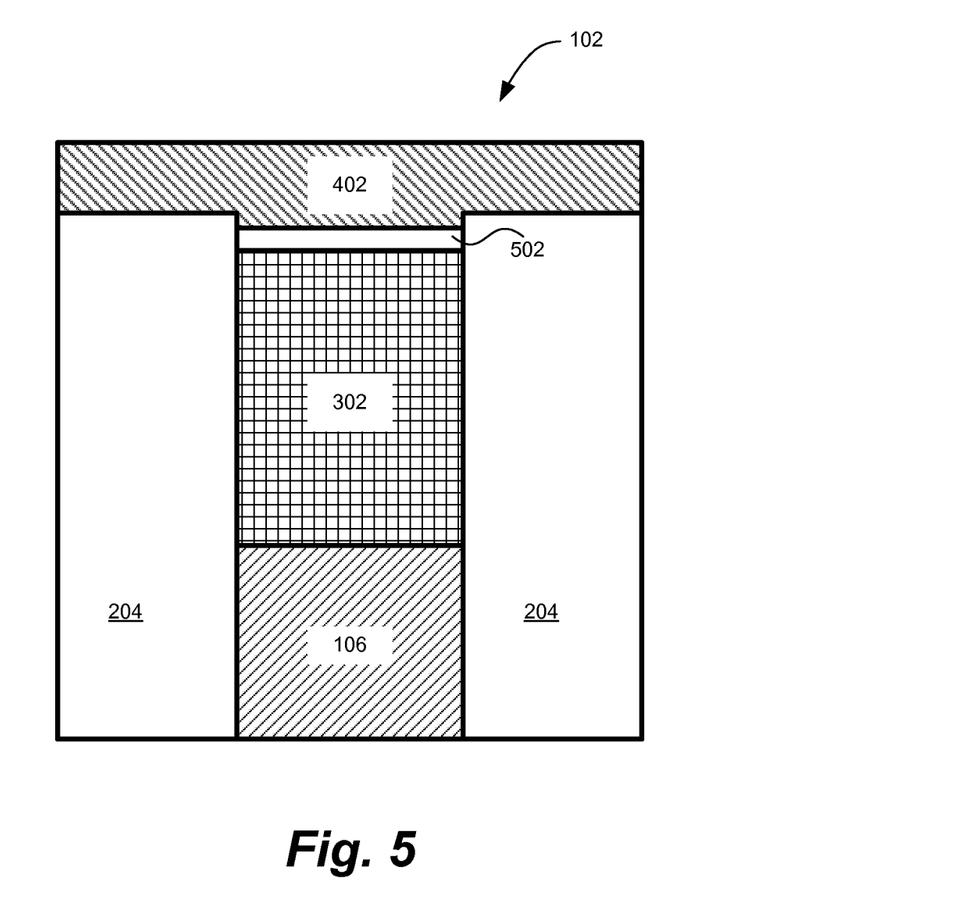
FIG. 5 illustrates a void formed between the phase change material and the thermally insulating layer.

Since the phase change material 302 crystallizes from the bottom of the via 202 to the top of the via 202, voids formed in the phase change material 302 during the initial crystallization are propagated to the top of via 202. This is shown in FIG. 5, where a void 502 is formed between the phase change material 302 and the thermally insulating layer 402.

Figure 6:
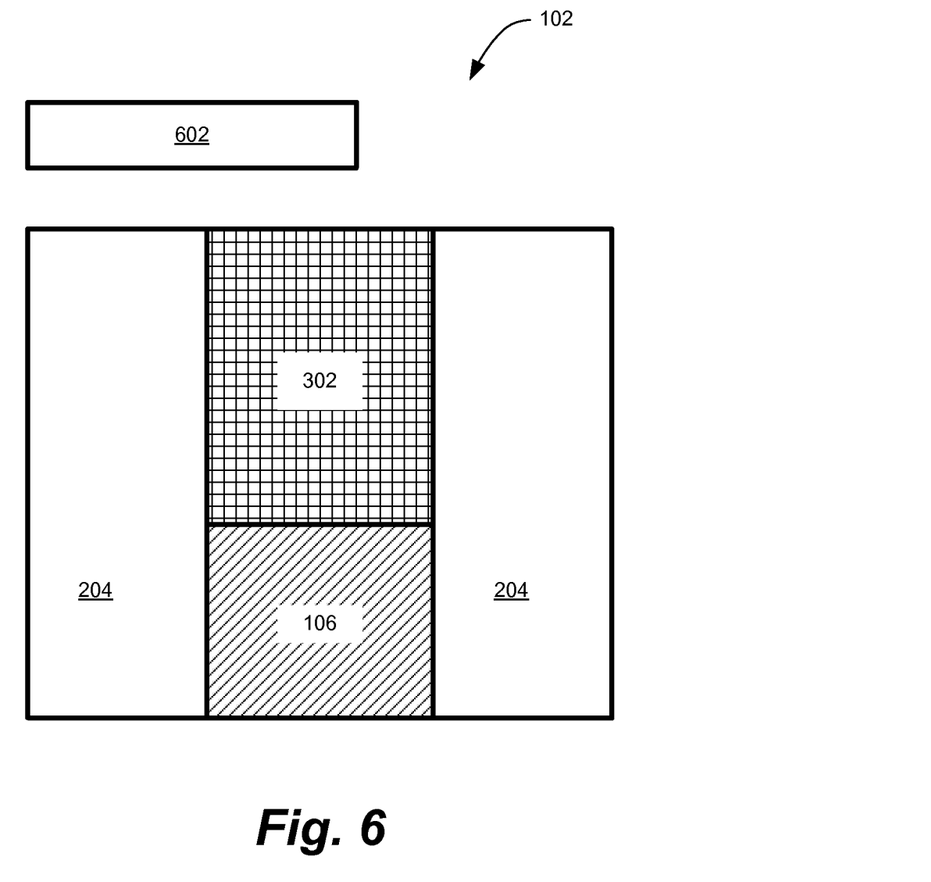
FIG. 6 shows a chemical mechanical polish performed after the phase change material is annealed.

At FIG. 6, a chemical mechanical polish (CMP) is performed after the phase change material 302 is annealed. The CMP removes the thermally insulating layer, capping layer (if used), and any voids present at the top of the phase change material. This desirably leaves the phase change layer void free when the phase change material is in a crystalline phase. In one embodiment of the invention, a polisher 602 is used to polish the voids from the top of the phase change material 302.

Figure 7:
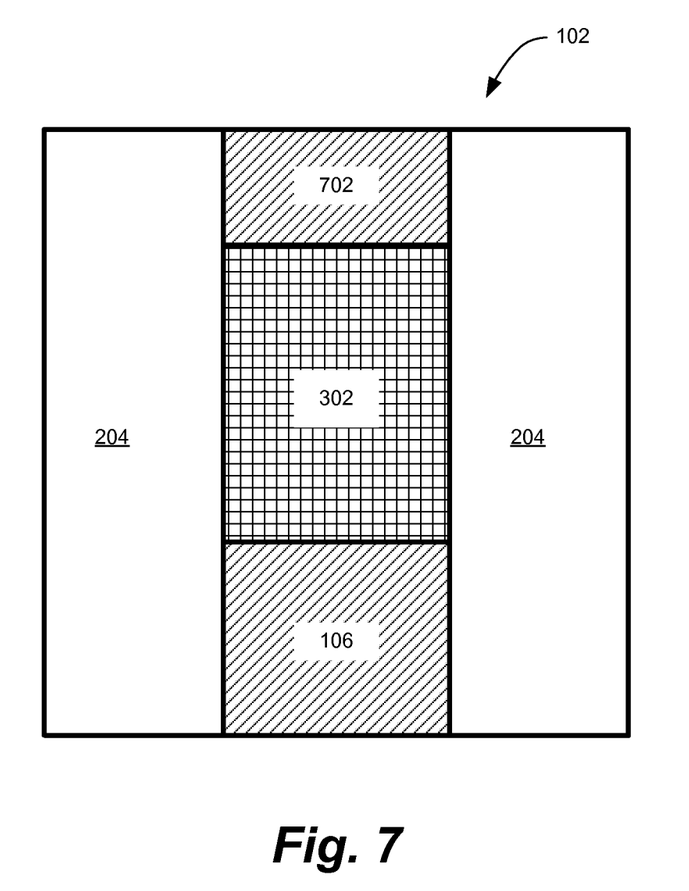
FIG. 7 shows a memory cell with top and bottom electrodes, and void free phase change material.

At FIG. 7, a top electrode 702 is shown formed over the phase change material 302 after CMP is performed. The top electrode 702 may be composed of, for example, titanium nitride (TiN) or tungsten (W). Thus, the memory cell formed includes phase change material 302 that is void free in the crystalline phase between a top electrode 702 and a bottom electrode 106.

Figure 8:
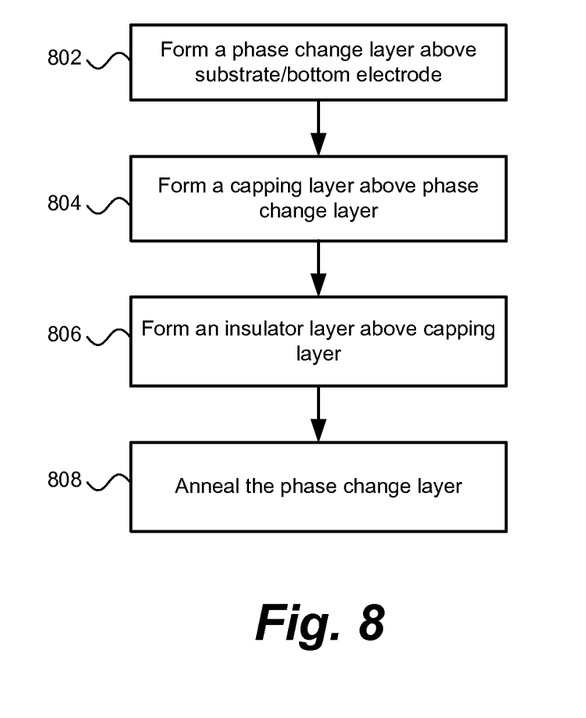
FIGS. 8-11 show various methods for forming a memory cell, as contemplated by the present invention.

FIG. 8 illustrates an embodiment of a method contemplated by the present invention for forming a memory cell. The process flow begins at forming operation 802. During forming operation 802, the phase change layer is formed above the bottom electrode and above the substrate. As described above, the bottom electrode is formed within the substrate. As stated above, the phase change layer may be in crystalline form and a variety of materials may be used as long as the phase change material used can be programmed to the crystalline phase or the amorphous phase. Those skilled in the art will recognize that a variety of processes may be utilized to deposit the phase change material in a via above the bottom electrode including, but not limited to, atomic layer deposition (ALD) and chemical vapor deposition (CVD). After forming operation 802 is completed, control passes to forming operation 804.

During forming operation 804, the capping layer is formed above the phase change layer. As stated above, the capping layer is comprised of material that does not interact with the phase change layer and it should not be a strong thermal conductor. Again, a variety of materials may be utilized for the capping layer. After forming operation 804 is completed, control passes to forming operation 806.

During forming operation 806, the insulator layer is formed above the capping layer. The insulator layer is comprised of a thermally insulating material. A variety of thermally insulating materials may be employed for the insulator layer as known to those skilled in the art. After forming operation 806 is completed control passes to annealing operation 808.

During annealing operation 808, the phase change layer is crystallized such that voids normally dispersed throughout the phase change layer congregate outside of the switching region and the resulting phase change inside the switching region is void free. The bottom electrode acts as a heat sink so that the phase change material is crystallized from the bottom. As a result, the voids move away from the switching region. In the cell construction shown in FIGS. 1A-1C, the switching region 810 may not encompass all the phase change material in the layer. In the cell construction methods using a via, the bottom of the via is constituted by the bottom electrode and as a result, the switching region reaches the lateral boundaries of the cell. After annealing operation 808 the method ends.

Figure 9:
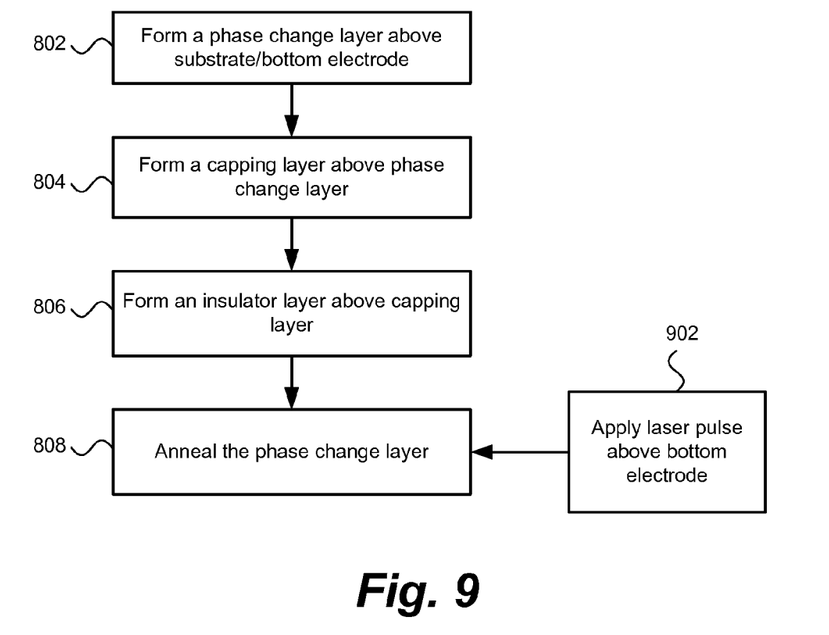

Turning to FIG. 9, an alternate embodiment of the method is shown. In this embodiment of the method, annealing operation 808 includes applying operation 902. During applying operation 902, a laser pulse is applied above the bottom electrode. The laser heats and melts the phase change layer, resulting in the crystallization of the phase change material to form a void free phase change layer.

Figure 10:
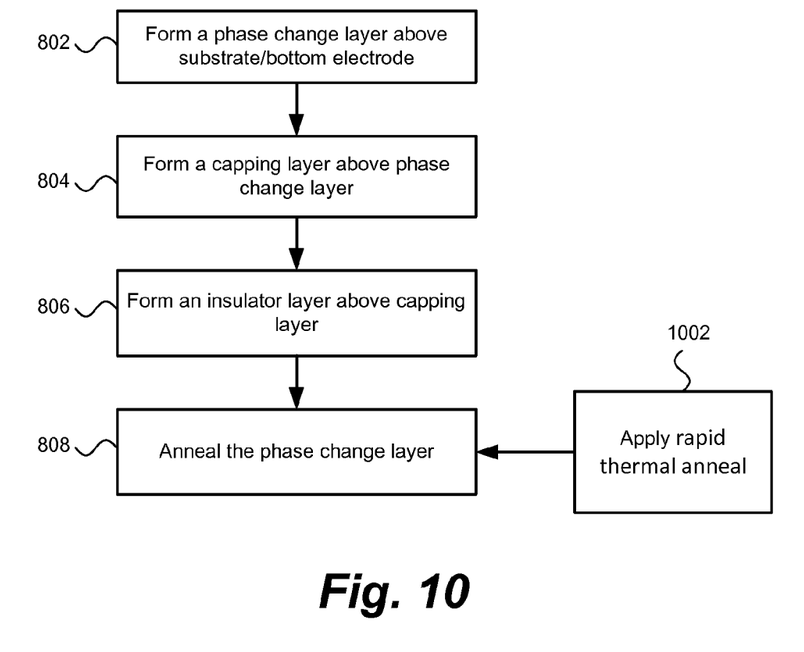

FIG. 10 illustrates another embodiment of a method for forming a memory cell contemplated by the present invention. In this embodiment, which applies preferably to the cell construction including a via, the annealing operation 808 includes applying operation 1002. During applying operation 1002, a rapid thermal anneal is utilized to crystallize the phase change layer. In one embodiment of the method, applying operation 1002 includes a heating operation and a cooling operation.

During heating operation, the rapid thermal anneal heats the phase change layer to 400-450° C. plateau. After heating operation is completed, control passes to heating operation. During the heating operation, the rapid thermal anneal quickly heats the phase change layer to 700-750° C. The phase change material in the phase change layer is heated to 700-750° C. for only approximately one second. After the heating operation is completed, control passes to a cooling operation.

During the cooling operation, the phase change layer is cooled for at least four seconds. This allows time for the phase change material in the phase change layer to crystallize. After the cooling operation is completed the rapid thermal anneal is completed.

Figure 11:
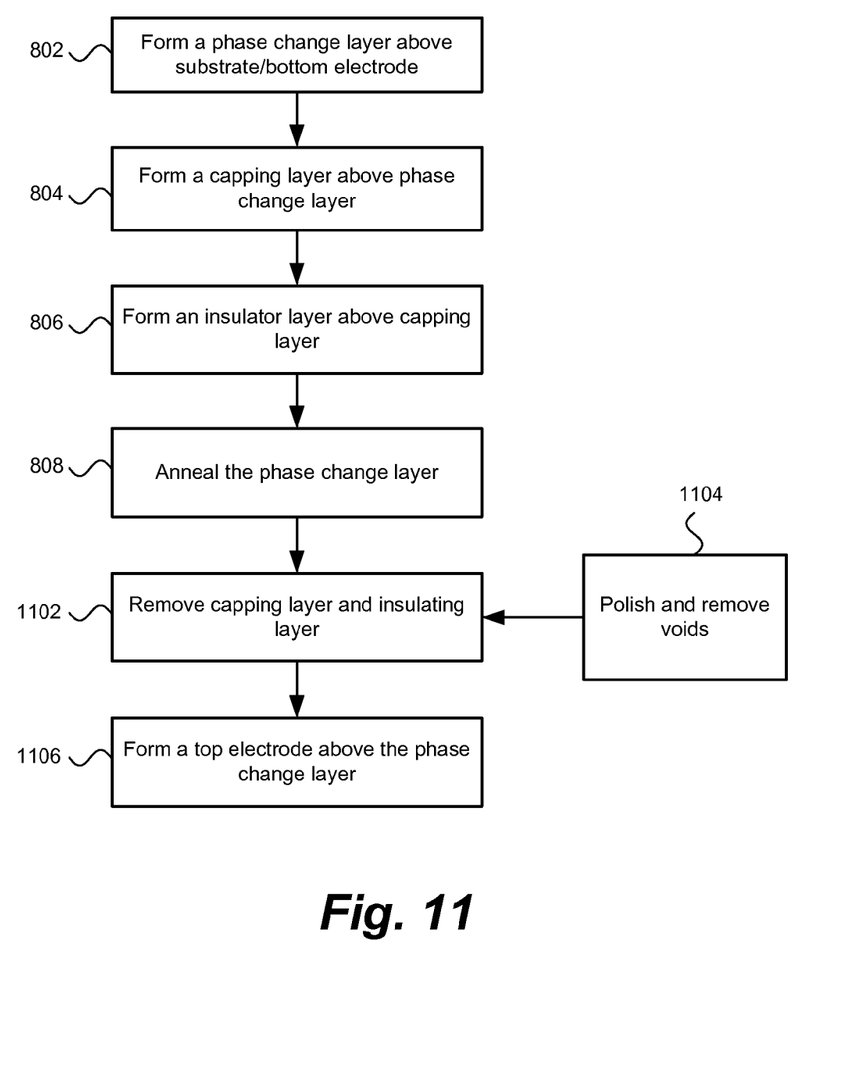

Turning to FIG. 11, yet another embodiment of the method is illustrated. In this embodiment of the invention, after annealing operation 808 is completed, control passes to removing operation 1102. During removing operation 1102, the insulator layer and the capping layer are removed. Those skilled in the art will recognize that a variety of process may be employed to remove the capping layer and the insulator layer such as, but not limited to, reactive ion etch (RIE) or wet etches such as dilute hydrofluoric acid (DHF). In one embodiment of the invention, removing operation 1102 includes polishing operation 1104.

During polishing operation 1104, a polish is applied to the phase change layer to remove the voids that have congregated at the top of the phase change layer. This leaves only the void free phase change layer above the bottom electrode. Those skilled in the art will recognize that a variety of polishes may be utilized for polishing operation 1104 including a chemical mechanical polish. After polishing operation 1104 is completed removing operation 1102 is completed and control passes to forming operation 1106.

During forming operation 1106, the top electrode is formed above the void free phase change layer. Those skilled in the art will recognize that a variety of processes may be utilized for forming a top electrode including a metal sputter. After forming operation 1106 is completed the process ends.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

What is claimed is:

1. A memory cell comprising:
   a substrate;
   a bottom electrode carried by the substrate, the bottom electrode being a thermal conductor;
   a phase change layer including phase change material, the phase change layer being void free within a switching region when the phase change material is in a crystalline phase;
   a top electrode over the phase change layer; and
   an insulator layer above the phase change layer, the insulator layer being a thermal insulator.

2. The memory cell of claim 1, wherein the phase change material is programmable between the crystalline phase and an amorphous phase.

3. The memory cell of claim 1, further comprising a via over the bottom electrode, wherein the bottom electrode forms the bottom of the via and the via is filled with the phase change material.

4. The memory cell of claim 1, further comprising a capping layer between the phase change layer and the insulator layer, the capping layer configured to not interact with the phase change layer and the insulator layer.

5. The apparatus of claim 1, wherein the insulator layer is comprised of 80 percent ZnS (zinc sulfide) and 20 percent SiO2 (silicon dioxide).

6. The memory cell of claim 1, further comprising a heater configured to temporarily melt the phase change material such that the phase change material crystallizes without voids within a switching region after melting.

7. The apparatus of claim 6, wherein the heater is a laser configured to apply at least one laser pulse over the bottom electrode.

8. The apparatus of claim 6, wherein the heater is further configured to perform a rapid thermal anneal (RTA).

9. The apparatus of claim 6, wherein the heater is configured to:
   heat the phase change layer to between 700° C. and 750° C. for approximately one second; and
   cool the phase change layer for at least four seconds.

* * * * *